(12) United States Patent
Redford et al.

(10) Patent No.: US 6,211,032 B1
(45) Date of Patent: Apr. 3, 2001

(54) METHOD FOR FORMING SILICON CARBIDE CHROME THIN-FILM RESISTOR

(75) Inventors: Mark Redford, Scotland (GB); Yakub Aliyu, Singapore (SG); Chic McGregor; Rikki Boyle, both of Greenock, PA (US); Haydn Gregory, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/187,244

(22) Filed: Nov. 6, 1998

(51) Int. Cl.[7] ............... H01L 21/20; H01L 21/4763; H01L 21/44

(52) U.S. Cl. ............... 438/384; 438/931; 438/648; 438/656; 438/685

(58) Field of Search ............... 438/384, 931, 438/648, 382, 381, 685, 656

(56) References Cited

U.S. PATENT DOCUMENTS

| | | | |
|---|---|---|---|
| 3,996,551 | 12/1976 | Croson | 338/309 |
| 4,296,309 * | 10/1981 | Shinmi et al. | 219/216 |
| 4,591,821 | 5/1986 | Paulson et al. | 338/308 |
| 4,682,143 * | 7/1987 | Chu et al. | 338/307 |
| 4,759,836 * | 7/1988 | Hill et al. | 204/192.21 |
| 4,975,386 * | 12/1990 | Rao | 437/60 |
| 5,081,439 | 1/1992 | Natzle et al. | 338/195 |
| 5,296,406 * | 3/1994 | Readdie et al. | 437/175 |
| 5,496,762 | 3/1996 | Sandhu et al. | 437/60 |
| 5,976,944 * | 11/1999 | Czagas et al. | 438/382 |
| 6,030,883 * | 2/2000 | Nishimoto et al. | 438/455 |

* cited by examiner

Primary Examiner—Richard Elms
Assistant Examiner—Adam Pyonin
(74) Attorney, Agent, or Firm—Mark C. Pickering

(57) ABSTRACT

A method for forming a thin-film resistor, which is composed of silicon, carbon, and chromium, is disclosed. The resistivity of the thin-film resistor, and therefore the resistance and temperature coefficient of resistance (TCR) of the resistor, are tailored to have specific values by varying the elemental composition of the silicon, carbon, and chromium used to form the resistor.

26 Claims, 6 Drawing Sheets

METHOD FOR FORMING SILICON CARBIDE CHROME THIN-FILM RESISTOR

RELATED APPLICATIONS

The present invention is related to application Ser. No. 09/188,782, U.S. Pat. No. 6,081,014, issued Jun. 27, 2000 for SILICON CARBIDE CHROME THIN-FILM RESISTOR by Mark Redford et al. which is filed on an even date herewith.

BACKGROUND OF THE INVENTION

1. Field of the Invention

The present invention relates to thin-film resistors and, more particularly, to a method for forming a thin-film resistor.

2. Description of the Related Art

A resistor is a common circuit element that provides a specified electrical resistance under specified conditions. Electrical resistance, in turn, is defined as the ratio of the potential difference between the ends of a conductor and the current flowing through the conductor.

A thin-film resistor is a type of resistor that is used with integrated circuits and, as the name suggests, is formed from a thin layer of resistive material. Numerous resistive materials, including lightly-to-heavily doped polysilicon, silicon chrome (SiCr), nichrome (NiCr), tantalum, and cermet (Cr—SiO), have been used to form thin-film resistors.

The performance of thin-film resistors is defined by a number of parameters which include the resistor value (the resistance that is supposed to be provided by the resistor), the resistor tolerance (the extent to which the resistance may deviate from the resistor value), and the temperature coefficient of resistance (TCR) (the amount the resistance changes with changes in temperature).

It is also important that similarly formed resistors have similar resistances (known as value matching), and similar variations with changes in temperature (known as tolerance tracking). Another parameter, known as an end effect, is a measure of a change in the length of the thin-film resistor that results from metalization spiking into the thin-film resistor.

FIGS. 1A–1H show cross-sectional views that illustrate a process for forming a conventional thin-film resistor. As shown in FIG. 1A, the method begins with a conventionally formed wafer 100 that includes a semiconductor material 110, such as an epitaxial layer or a substrate, and a layer of oxide 112 approximately 5,500 Å thick which is formed on the surface of material 110. In addition, wafer 100 also includes a surface contact region 114.

From this point, as shown in FIG. 1B, a layer of aluminum 116 is cold deposited over oxide layer 112 and material 110 in contact region 114. Following this, a first mask 120 is formed and patterned on the surface of aluminum layer 116 to define a resistor region 122 on the surface of oxide layer 112.

Once mask 120 has been patterned, as shown in FIG. 1C, the unmasked regions of aluminum layer 116 are etched until aluminum layer 116 has been removed from resistor region 122 on the surface of oxide layer 112. After this, mask 120 is removed.

Next, as shown in FIG. 1D, a thin-film layer of silicon chromium 124, is deposited over aluminum layer 116 and resister region 122 on the surface of oxide layer 112. The film composition of the silicon chromium is approximately 72% silicon and 28% chromium.

Following this, a second mask 126 is formed and patterned over thin-film resistive layer 124 to define a plurality of resistors 130. Once mask 126 has been patterned, as shown in FIG. 1E, the unmasked regions of thin-film resistive layer 124 are etched until the unmasked regions of thin-film resistive layer 124 have been removed.

After this, as shown in FIG. 1F, aluminum layer 116 and mask 126 are removed. Next, as shown in FIG. 1G, a second aluminum layer 134 is cold deposited over oxide layer 112, resistors 130, and material 110 to form an interconnect. Next, a third mask 136 is formed and patterned on interconnect layer 134 to define metal interconnect tracks.

Once mask 136 has been patterned, as shown in FIG. 1H, the unmasked regions of interconnect layer 134 are etched until the unmasked regions of interconnect layer 134 have been removed. After this, mask 136 is removed.

Although the above-described process produces thin-film resistors which are adequate for the needs of current generation products, future products are expected to require thin-film resistors which have a greater precision than those currently being produced. Thus, there is a need for a thin-film resistor which has greater precision than current generation thin-film resistors.

SUMMARY OF THE INVENTION

The present invention is directed to a method for forming a thin-film resistor. The thin-film resistor of the present invention is formed on a semiconductor device which has a semiconductor material and an isolation region that is formed on the semiconductor material.

In accordance with the present invention, the method of the present invention begins by forming a layer of sacrificial material on the isolation region. Next, a selected portion of the layer of sacrificial material is removed to form an exposed portion of the isolation region.

After this, a layer of resistive material is formed over the exposed portion of the isolation region and the layer of sacrificial material. The layer of resistive material includes a percentage by weight of silicon, a percentage by weight of carbon, and a percentage by weight of chromium. Next, selected portions of the layer of resistive material are removed to form a resistor. Following this, the layer of sacrificial material is removed.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 2A–2H show cross-sectional views that illustrate a method for forming a thin-film resistor, and connecting the resistor to a contact region in accordance with the present invention. As described in greater detail below, the method of the present invention provides precision thin-film resistors by utilizing silicon carbide chrome as the resistive material.

Figure 1A:
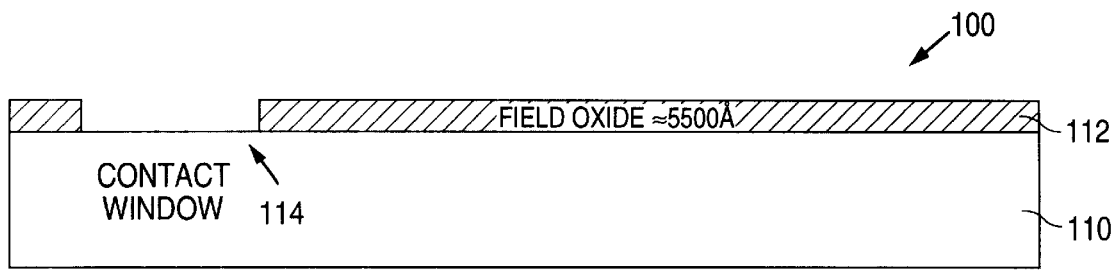
FIGS. 1A–1H are cross-sectional views illustrating a process for forming a conventional thin-film resistor.
Figure 1B:
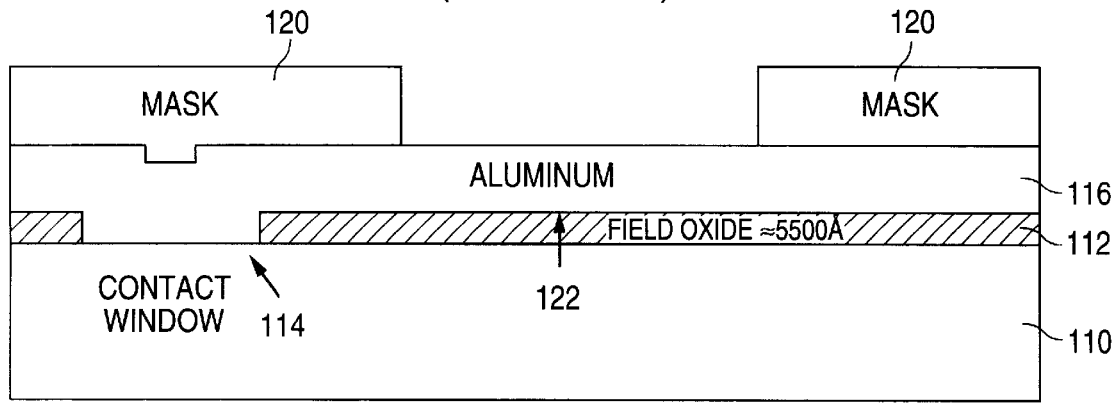
Figure 1C:
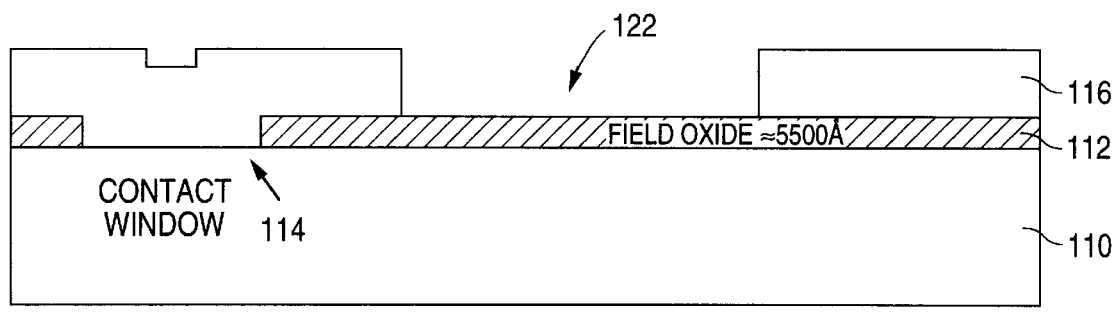
Figure 1D:
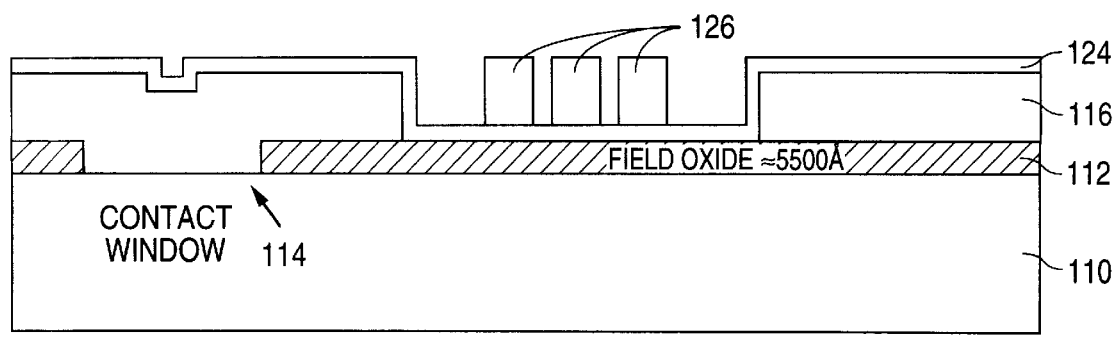
Figure 1E:
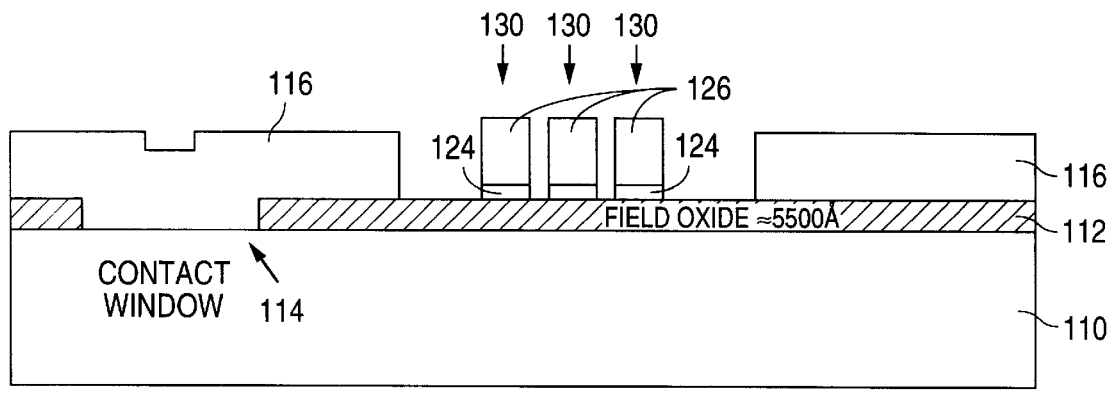
Figure 1F:
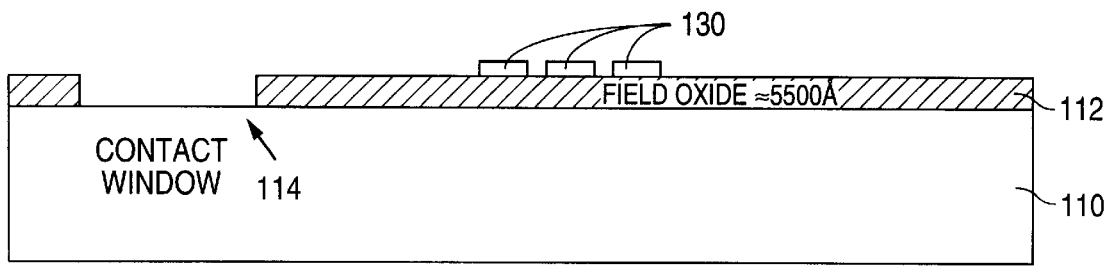
Figure 1G:
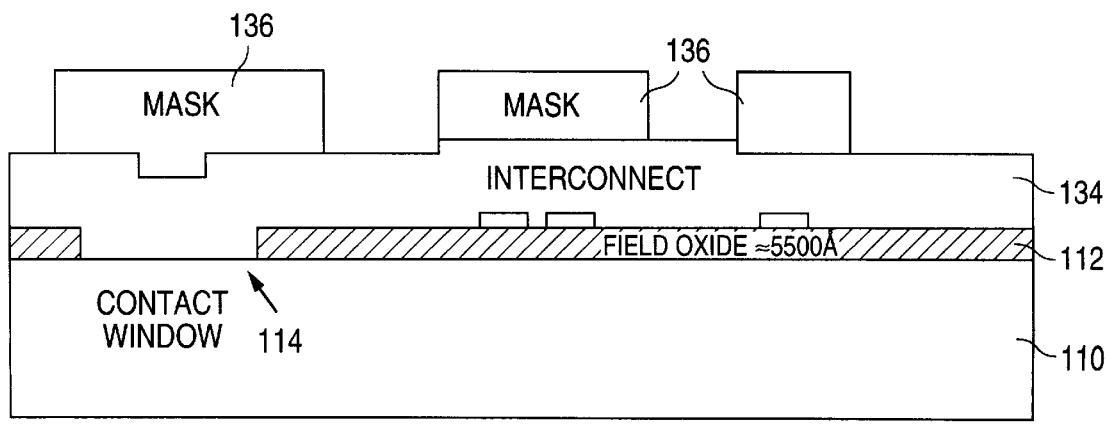
Figure 1H:
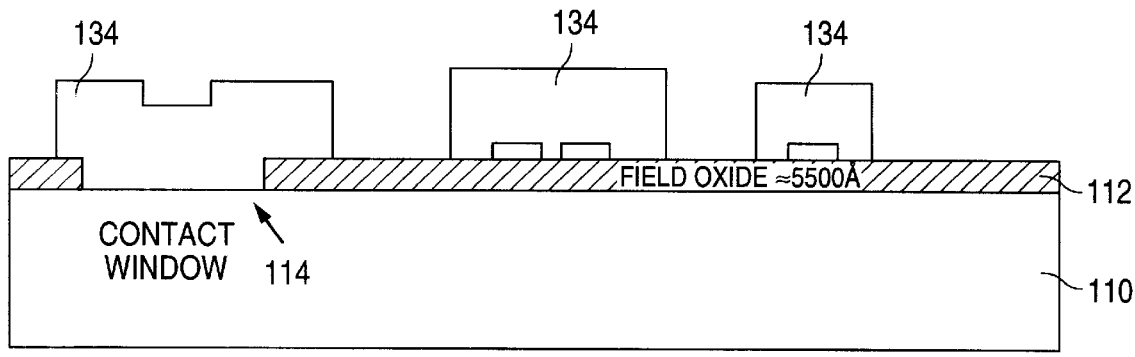
Figure 2A:
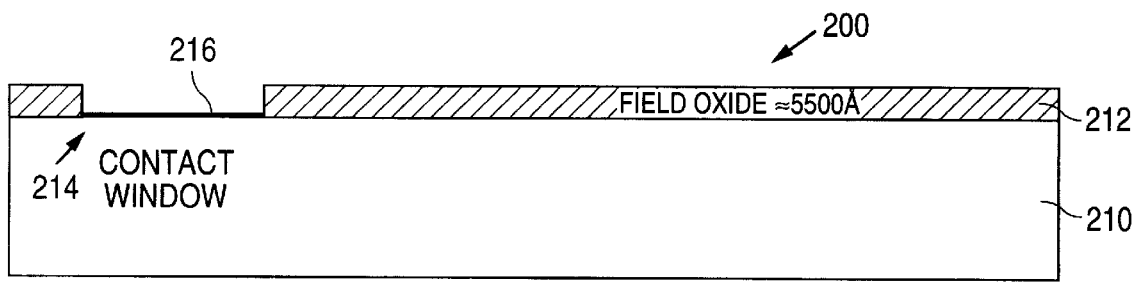
FIGS. 2A–2H are cross-sectional views illustrating a method for forming a thin-film resistor, and connecting the resistor to a contact region in accordance with the present invention.

As shown in FIG. 2A, the method begins with a conventionally formed wafer 200 that includes a semiconductor material 210, such as an epitaxial layer or a substrate, and a layer of oxide 212 approximately 5,500 Å thick which is formed on the surface of material 210. In addition, wafer 200 also includes a surface contact region 214. Although not required, a layer of platinum silicide 216 may be formed on a portion of material 210 in surface contact region 214.

If a layer of platinum silicide is present, wafer 200 is pre-cleaned in a solution of $NH_4F$ at 18±2° C. for five minutes to remove oxide from the surface of platinum silicide layer 216. The oxide on the surface of platinum silicide layer 216 is typically grown during the last part of the annealing step which forms layer 216 to protect layer 216 from a subsequent etch that removes the unreacted platinum.

Figure 2B:
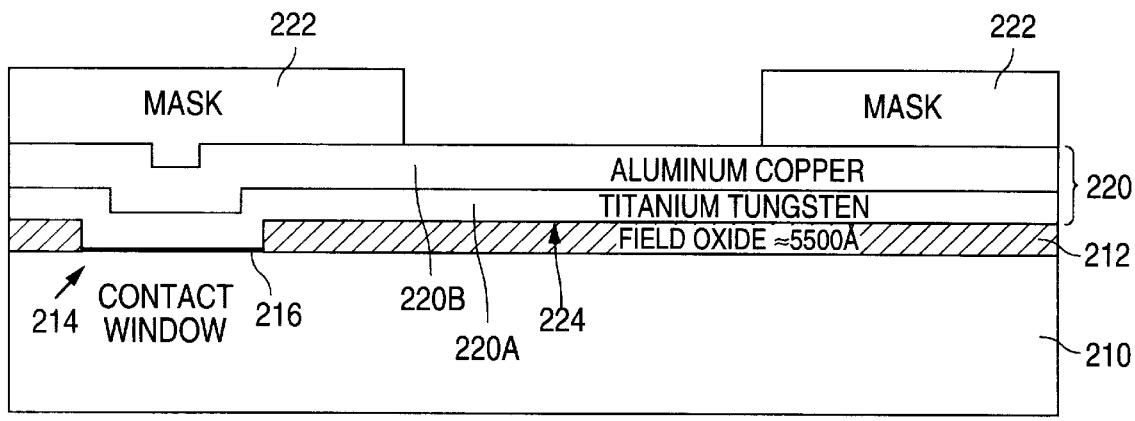

As shown in FIG. 2B, a layer of sacrificial material 220 is then formed on oxide layer 212 and platinum silicide layer 216. In the present method, sacrificial layer 220 is formed by forming a layer of titanium tungsten 220A on oxide layer 212 and platinum silicide layer 216, and a layer of aluminum copper 220B on layer 220A. (Alternately, other materials, such as a layer of doped polysilicon, can also be used as the sacrificial material).

Titanium tungsten layer 220A, which is about 1500 Å thick, is comprised of approximately 15% titanium and 85% tungsten. In addition, the relatively thick layer of titanium tungsten layer 220A, which is deposited at 250° C. using a Varian 3290 sputter system, is used as a diffusion barrier to prevent aluminum copper layer 220B from reacting with platinum silicide layer 216. When aluminum reacts with silicide layer 216, silicon pits and aluminum spikes may be formed which can short out shallow junctions. (Other materials, such as nitrides, carbides, and silicides may also be used as a diffusion barrier ($COSO_2$ reacts at as 400° C.)).

The thickness of titanium tungsten layer 220A is monitored by using the sheet resistance. Thus, when the sheet resistance is equal to 4.67 micro-ohms/square (±1.27 micro-ohms/square), titanium tungsten layer 220A is approximately 1500 Å thick. (The sheet resistance is checked on test wafers before production wafers are used).

After titanium tungsten layer 220A has been deposited, aluminum copper layer 220B is deposited on titanium tungsten layer 220A at 40° C. Aluminum copper layer 220B, which is comprised of approximately 99.5% aluminum and 0.5% copper, is formed to have a thickness of approximately 8000 Å as this is the maximum thickness that can be deposited without causing a deterioration in the control of the critical dimensions.

As above, the thickness of aluminum copper layer 220B is monitored by using the sheet resistance (test wafers only). Thus, when the sheet resistance is equal to 0.038 ohm, aluminum copper layer 220B is approximately 8000 Å thick.

After sacrificial layer 220 has been formed, a first mask 222 is formed over sacrificial layer 220 to define a resistor region 224 on the surface of oxide layer 212. For critical resistor dimensions, it is necessary to maintain at least 20 μm between the resistor and an active area. For non-critical resistors, however, this distance can be reduced to 10 μm.

Mask 222 is formed by first applying Vapour Prime (hexa-methy-di-silane), manufactured by East Kilbride Chemicals (EKC) Ltd., which serves to improve resist adhesion. Next, a positive resist, such as HPRP504 manufactured by OCG Ltd., is spun on to a thickness of 1.25 μm (±0.05 μm), and then baked at 100° C.±2° C. for approximately 50 seconds.

Following this, the masks are aligned, and the resist is exposed at 80 μJ, aperture size one, to create a pattern on sacrificial layer 222. The exposure energy of 80 μJ is used because it results in an optimum uniformity of the critical dimensions at final inspection.

The exposure energy determines the amount of resist exposed, and hence the quality of the sidewall angle and the characteristic of the critical dimension that is obtained. A decrease in the exposure energy results in an increase in the critical dimensions, and thus decreases the intended resistor value.

Once the resist has been exposed, the pattern on the resist is developed. Following this, the wafer is baked at 115°C. (±2° C.) for approximately 50 seconds. Baking hardens the resist, promoting resist adhesion and stability which, in turn, improves the ability of the resist to withstand chemical attack during the etch process that follows This and each subsequent masking step may be run on a stepper photolithography tool or a projection align tool. The stepper photolithography tool, however, provides more accuracy with respect to line definition across both the wafer and the die. This, in turn, results in better resistor matching. (A projection align mask is a 1× mask which means that what is printed on the plate is printed on the wafer. On the other hand, the reticle used with the stepper tool provides more precision because the reticle is 5× what goes on the wafer.)

Figure 2C:
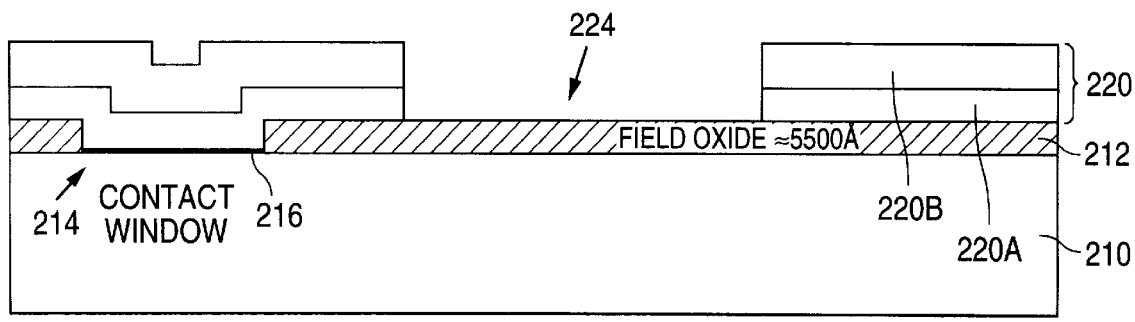

After this, as shown in FIG. 2C, the exposed regions of the resist and the underlying sacrificial layer 220 (layers 220B and 220A ) are etched until layer 220A has been removed from resistor region 224 on the surface of oxide layer 212.

Specifically, aluminum copper layer 220B is wet etched with phosphoric/acetic/nitric acid at a concentration of 40/4/1 at 46° C. (±2° C.) for 130 seconds, with a six second overetch, and then rinsed. Titanium tungsten layer 220A is wet etched in a 30% solution of $H_2O_2$ at 65° C. (±2° C.) for 6.8 minutes, and then rinsed.

Following the etch of titanium tungsten layer 220A, the unexposed layer of resist is removed with PosiStrip 830, a resist remover manufactured by EKC Ltd. at 85° C. (±5° C.) for 7.5 minutes, and then rinsed. The process is then repeated for 7.5 minutes.

Figure 2D:
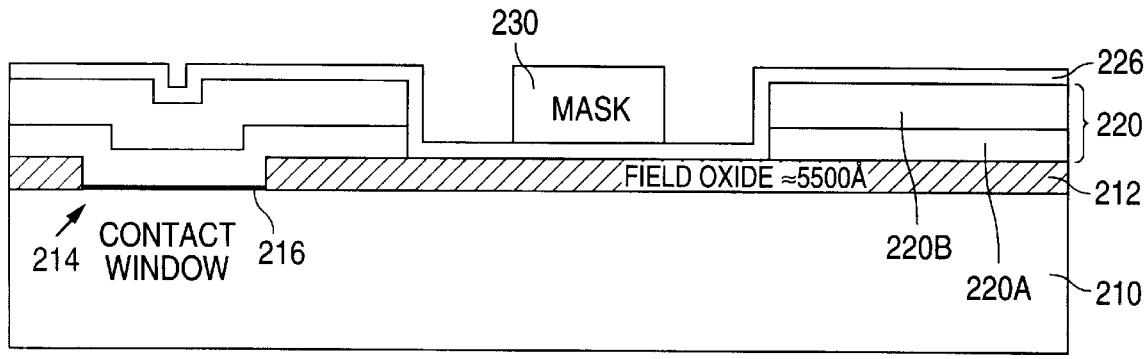

Turning now to FIG. 2D, after mask 222 has been removed, a layer of silicon carbide chrome (SiCCr) 226 approximately 50 Å to 100 Å thick is deposited on oxide layer 212 and sacrificial layer 220 with a Varian sputter system at 40° C., a pressure of 3 mT (used to standardize all of the deposition recipes), and a power of approximately 100 W. (At higher powers, there is a risk of cracking the target).

The deposition temperature is set at 40° C. because films deposited at this temperature, and within the range of 15° C.–65° C., have proven to possess superior performance characteristics (better uniformity and temperature coefficient of resistance (TCR)) than those films deposited at higher temperatures. As above, the thickness is monitored by using the sheet resistance (test wafers only) which is targeted to 1000 ohms/square. Sheet resistances of 800–1200 ohms/square correspond with SiCCr thicknesses of approximately 65–100 Å.

The silicon carbide chrome is deposited on a dedicated sputter tool in order to avoid the introduction of impurities and oxide growth on the target which could impact resistor parametrics.

In addition, the atomic composition of the carbon and silicon can be combined in the form of SiC for ease of manufacturability. The SiCCr target is very brittle and difficult to manufacture.

After the layer of silicon carbide chrome (SiCCr) 226 has been deposited, a second mask 230 is formed over SiCCr layer 226 by first spinning on a positive resist, such as HPRP504, to a thickness of 1.25 $\mu$m ($\pm$0.05 $\mu$m). The masks are aligned, and the resist is exposed at 80 mJ, aperture size one, to create a pattern on layer 226. Once the resist has been exposed, the pattern on the resist is developed. Following this, the wafer is baked at 115° C. ($\pm$2° C.) for approximately 50 seconds.

Figure 2E:
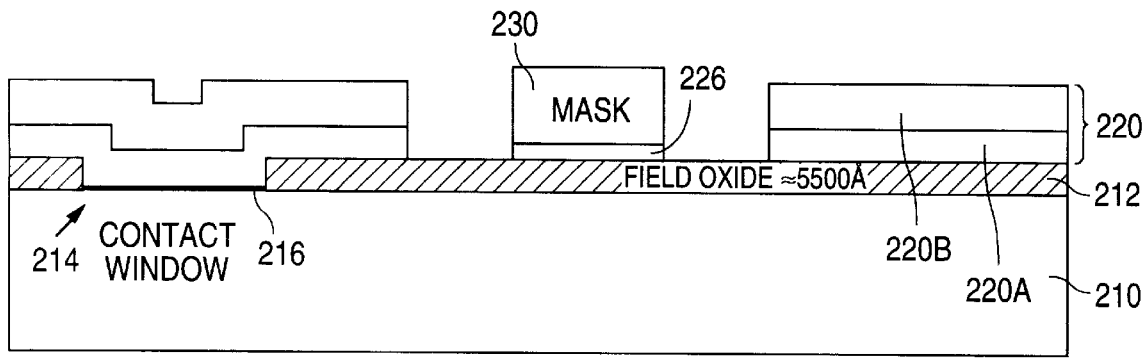

After this, as shown in FIG. 2E, the exposed regions of the resist and the underlying layer of silicon carbide chrome 226 are etched away in an Electrotech Omega 2 RIE etcher using a chlorine chemistry ($SiCl_4$/Ar/$Cl_2$ —63/30/24 sccm) for two minutes at 94 W and a pressure of 150 mT.

A chlorine-based chemistry is used because silicon, carbon, and chromium all form volatile compounds when exposed to this gas. At low vapor pressure, the material removed can be easily evacuated from the etch chamber.

The etch time was determined by evaluating the amount of time required to etch the film, and then increasing the time to include an overetch to insure a reliable process. An upper limit on the etch time depends on the amount of resist that is removed while the silicon carbide chrome film is being etched. For example, the two minute etch step removes approximately 2400 Å of resist.

Following the etch, residual chlorine is present on the wafers which reacts with moisture in the air to form hydrochloric acid. To prevent corrosion from occurring, wafer 200 is rinsed in deionized water immediately after the etch, and then dried in warm nitrogen gas. In addition to rinsing the wafers, the semitool must also be rinsed to remove any residual chlorine so as to prevent cross-contamination during subsequent processing steps.

Figure 2F:
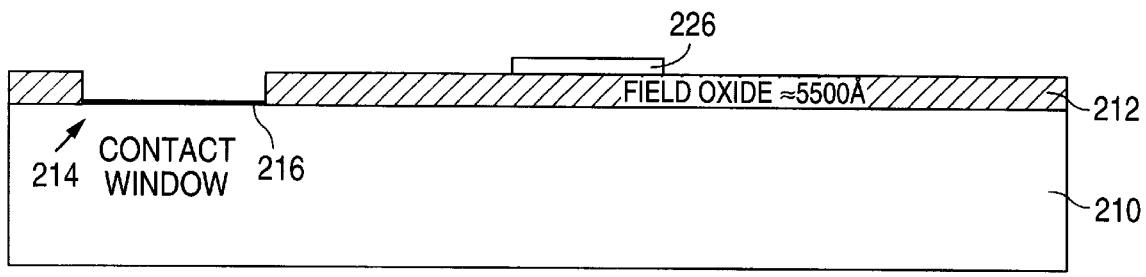

After SiCCr layer 226 has been etched, sacrificial layer 220 is removed as shown in FIG. 2F. Specifically, aluminum copper layer 220B is wet etched with phosphoric/acetic/nitric acid at a concentration of 40/4/1 at 46° C. ($\pm$2° C.) for 130 seconds, with a six second overetch, to remove layer 220B. Following the etch, wafer 200 is rinsed.

Next, mask 230 is removed with PosiStrip 830 at 85° C. ($\pm$5° C.) for 7.5 minutes. The process is repeated for 7.5 minutes, followed by the rinsing of wafer 200. Once the resist has been removed, titanium tungsten layer 220A is wet etched in a 30% solution of $H_2O_2$ at 65° C. ($\pm$2° C.) for 6.8 minutes to remove layer 220A. After this, wafer 200 is rinsed.

Figure 2G:
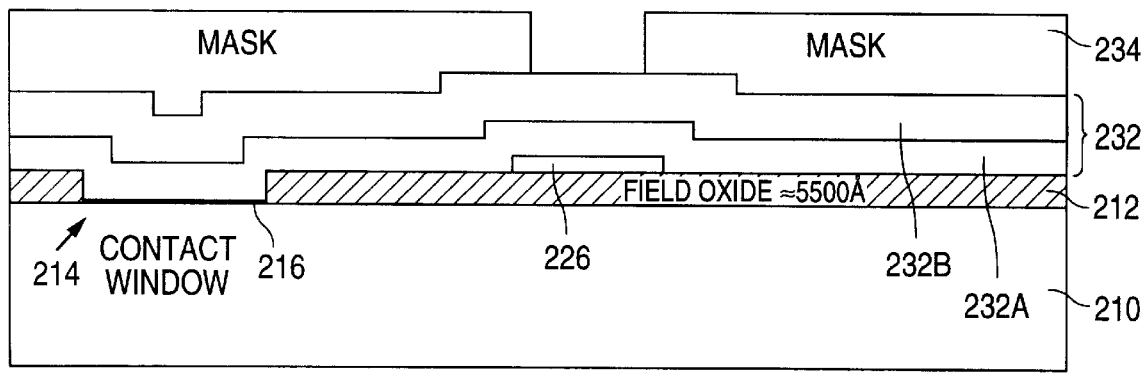

Following this, a layer of interconnect material 232 is formed. As shown in FIG. 2G, interconnect layer 232 is formed from a layer of titanium tungsten 232A, and a layer of aluminum copper silicon 232B which is formed over layer 232A.

Titanium tungsten layer 232A is deposited on the layers of platinum silicide 216, oxide layer 212, and silicon carbide chrome layer 226 at 250° C. using the Varian 3290 sputter system. (The precleaning step that preceded the deposition of the first layer of titanium tungsten 220A is preferably omitted at this point to minimize the risk of damaging the thin SiCCr film).

As with titanium tungsten layer 220A, the titanium tungsten layer 232A is also comprised of approximately 15% titanium and 85% tungsten, and formed to a depth of approximately 1500 Å based on a sheet resistance of 4.67 micro-ohms/square ($\pm$1.27 micro-ohms/square). In addition, the thickness of titanium tungsten layer 232A also prevents aluminum copper silicon layer 232B from reacting with platinum silicide layer 116.

After titanium tungsten layer 232A has been deposited, aluminum copper silicon layer 232B, which is comprised of approximately 97% aluminum, 2% copper, and 1% silicon, is deposited on the layer of titanium tungsten 232A at 355° C. using the Varian 3290 sputter system.

The aluminum copper alloy is associated with the resulting preferred {111} texture and improved grain size distribution as in the bamboo structure. See, for example, S. Vidaya et al., "Linewidth Dependence of Electromigration in Evaporated Al-0.5% Cu", Appl. Phys. Lett., 36, 464 (1980).

Layer 232B is formed to have a thickness of approximately 6000 Å to 9000 Å which, in turn, corresponds to a sheet resistance of 43.25 micro-ohms/square $\pm$7.05 micro-ohms/square.

After interconnect layer 232 has been formed, as shown in FIG. 2G, a third mask 234 is formed over layer 232. Specifically, Vapour Prime is applied to layer 232B. Next, a positive resist, such as HPRP504, is applied to a thickness of 1.25 $\mu$m ($\pm$0.05 $\mu$m), and then baked at 100° C. ($\pm$2° C.) for approximately 50 seconds.

Following this, mask 234 is aligned, and the resist is exposed at 80 mJ, aperture size one, to create a pattern on the aluminum layer 232B. Once the resist has been exposed, the pattern on the resist is developed, and then baked at 115° C. ($\pm$2° C.) for approximately 50 seconds.

Figure 2H:
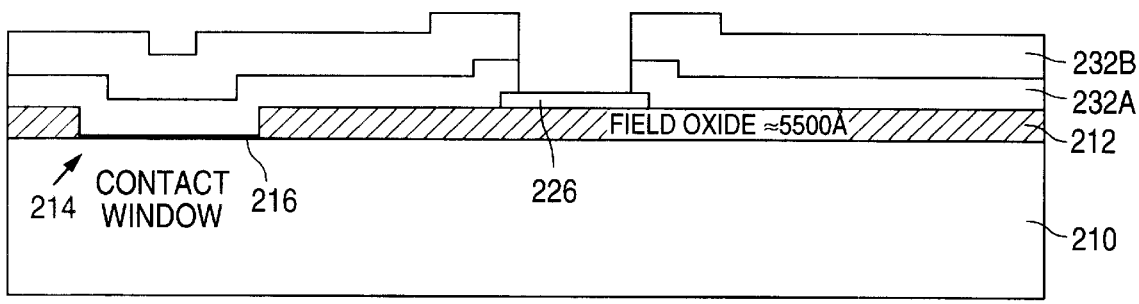

After this, as shown in FIG. 2H, the exposed regions of the resist and the underlying layer of aluminum copper silicon 232B are wet etched with phosphoric/acetic/nitric acid (40/4/1) at 46° C. ($\pm$2° C.) for 100–135 seconds, and then for an additional six seconds as an overetch. After the etch is completed, the wafer is then rinsed.

Following this, the wafer is wet etched with DI/acetic/orthophosphoric/7:1 BOE/$NH_3$FL (60:20:12:300:3:5) [defreckle etch] at 18–22° C. for 150 seconds to remove any residual silicon left on the surface of the wafer after etching layer 232B because layer 232B contains a small percentage of silicon. After the etch is completed, the wafer is again rinsed.

After the rinse, the unexposed layer of resist 234 is removed with PosiStrip 830 at 85° C. ($\pm$5° C.) for 7.5 minutes, and then rinsed. The process is then repeated for 7.5 minutes.

Once the resist has been removed and the wafer rinsed, the layer of titanium tungsten 232A is wet etched in a 30% solution of $H_2O_2$ at 65° C. ($\pm$2° C.) for 6.8 minutes. Following this, the wafer is rinsed and then inspected.

Figure 3:
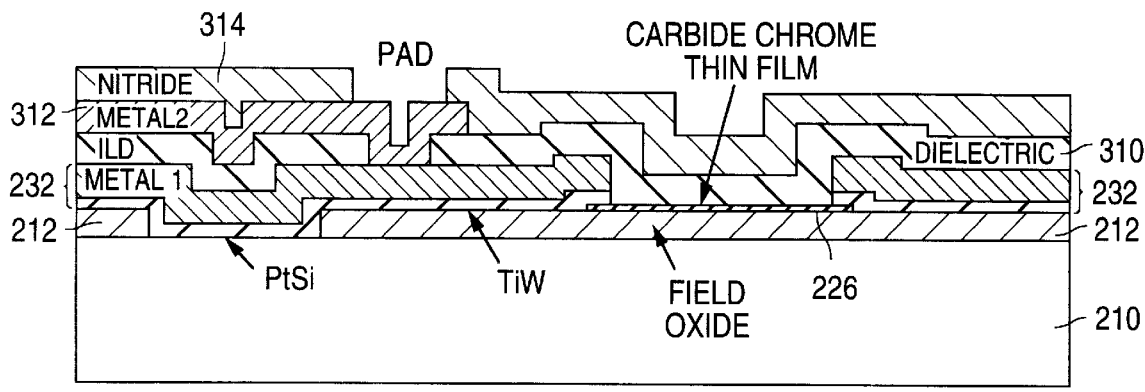
FIG. 3 is a cross-sectional diagram that illustrates a thin-film resistor prior to an end of the line anneal step in accordance with the present invention.

Conventional back-end processing steps are then followed to form the wafer shown in FIG. 3. Specifically, a layer of dielectric material 310 is deposited over interconnect trace 232. As shown in FIG. 3, the layer of dielectric material is then etched to form an opening that exposes a portion of interconnect trace 232.

After this, a layer of metal (metal-2) 312 is deposited over dielectric layer 310 and the exposed portion of interconnect trace 232. Selected portions of metal-2 layer 312 are then removed as required by the circuit layout. Next, a layer of nitride 314 is deposited over metal-2 layer 312 and the exposed portions of dielectric layer 310. The layer of nitride 314 is then etched to form an opening that exposes a portion of metal-2 layer 312.

In accordance with the present invention, the last manufacturing step prior to wafer test is an end of the line anneal step where wafer 200 is baked for 30 minutes at 450° C. in a 100% $H_2$ ambient with eight standard liters per minute (SLPM).

The end of the line anneal step is an additional processing step that significantly improves and stabilizes the TCR and sheet resistance of the SiCCr thin film resistors. For example, a SiCCr thin-film resistor having a composition by weight of 30% silicon, 20% carbon, and 50% chromium has a TCR of approximately −100 ppm/° C. before the end of the line anneal, and a TCR of approximately −60 ppm/° C. after the end of the line anneal. (Those skilled in the art will recognize that the end of the line anneal step does not have to be the last manufacturing step, but is conveniently the last step and could be performed after interconnect layer 232 has been formed, after dielectric layer 310 has been deposited, or after metal-2 layer 312 has been deposited).

Figure 4A:
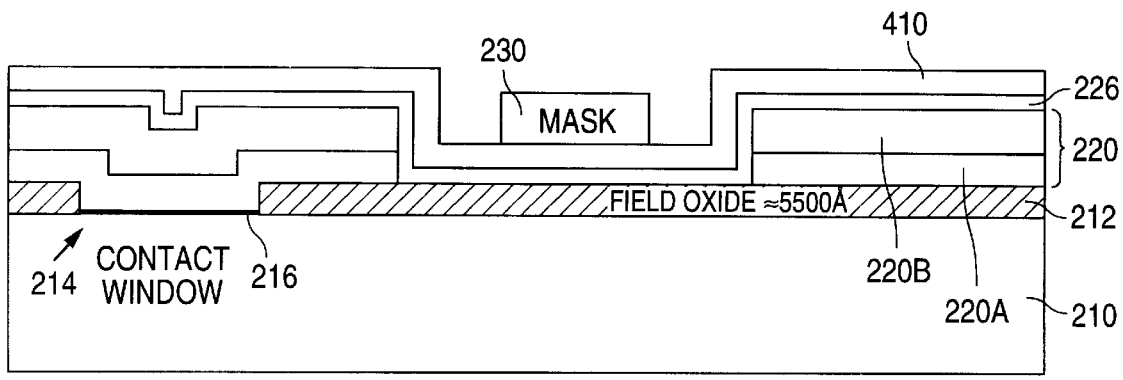
FIGS. 4A–4C are cross-sectional views that illustrate an alternate process in accordance with the present invention.
Figure 4B:
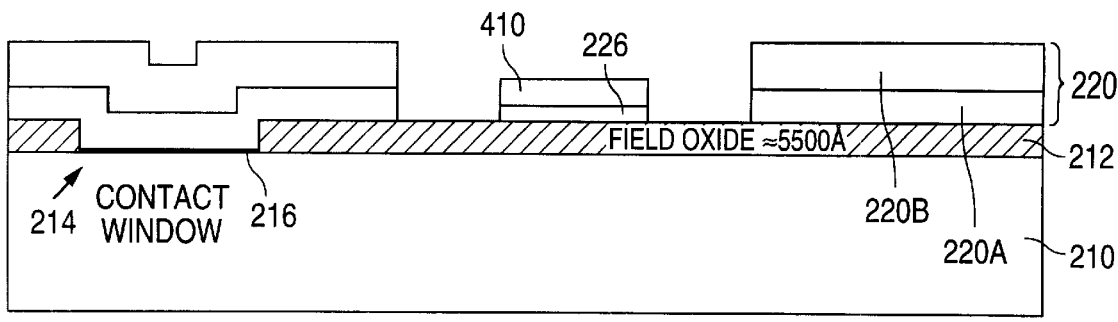
Figure 4C:
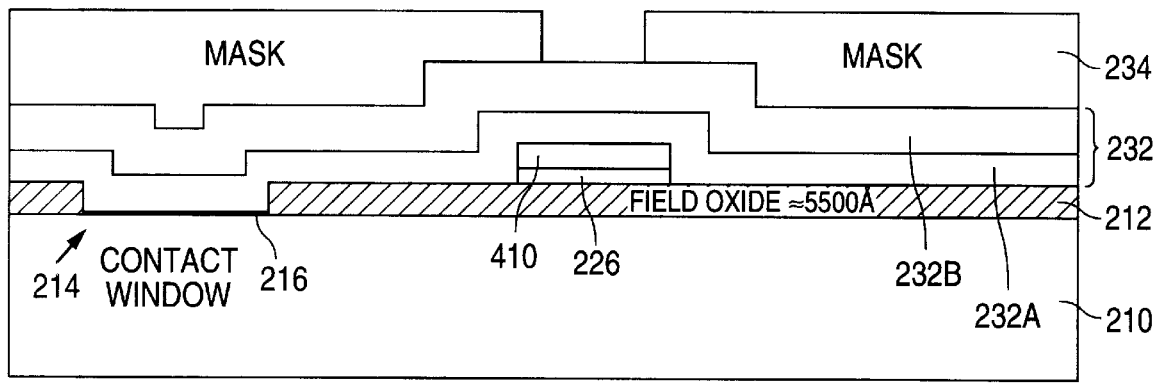

FIGS. 4A–4C show a series of cross-sectional drawings that illustrate an alternate process in accordance with the present invention. As shown in FIG. 4A, the alternate process is the same as the process of FIGS. 2A–2H up to and including the deposition of SiCCr layer 226.

In the alternate process, after SiCCr layer 226 has been deposited, a layer of protective material 410, such as an oxide, is deposited over SiCCr layer 226 at 420° C. An oxide layer deposited at 420° C. is often referred to as a low temperature oxide (LTO).

The advantage of forming oxide layer 410 over SiCCr layer 226 is that oxide layer 410 protects SiCCr layer 226 from the effects of the subsequent etch steps. The subsequent etch steps, for example, may change the ratio of chrome to silicon carbide, and therefore the TCR of the resistor, or may cause the film to retain contaminants or some constitutient of the etch.

Oxide layer 410 is deposited to a thickness of approximately 200 Å or 1000 Å, and may be doped or undoped. The drawback of using a 200 Å-thick layer of oxide is that mask 230 may degrade and, therefore, lead to a deterioration in matching. This drawback is avoided by using the 1000 Å-thick layer of oxide. After oxide layer 410 has been deposited, second mask 230 is formed over oxide layer 410 as described above.

When oxide layer 410 is approximately 200 Å thick, the unmasked regions of oxide layer 410 and SiCCr layer 226 are etched as described above in an Electrotech Omega 2 RIE etcher using a chlorine chemistry ($SiCl_4/Ar/Cl_2$—63/30/24 sccm) for two minutes at 94 W and a pressure of 150 mT. Following the etch, second mask 230 is removed.

When oxide layer 410 is approximately 1000 Å thick, the unmasked regions of oxide layer 410 are etched in a dedicated Tegal oxide etcher. Following the etch, second mask 230 is removed. After this, SiCCr layer 226 is etched as described above in an Electrotech Omega 2 RIE etcher using a chlorine chemistry ($SiCl_4/Ar/Cl_2$—63/30/24 sccm) for two minutes at 94 W and a pressure of 150 mT using oxide layer 410 as the mask.

As above, following the etch, the wafer and semitool are rinsed to remove any residual chlorine. FIG. 4B shows the structure that results following the rinse after mask 230 has been removed (when a 200 Å-thick oxide is used), or after the etch has been completed (when a 1000 Å-thick oxide is used).

Another advantage of forming oxide layer 410 is that oxide layer 410 allows steeper edges to be formed during the etch step that etches SiCCr layer 226. Thus, rather than being defined by the sidewall of the resist which erodes during the etch step, the edges are defined by oxide layer 410 which suffers significantly less erosion during the etch.

The steeper edges mean that there is less of a chance that the film will break off, or have microcracks. In addition, the steeper edges also allow for a more consistent measurement during inspection.

Figure 5:
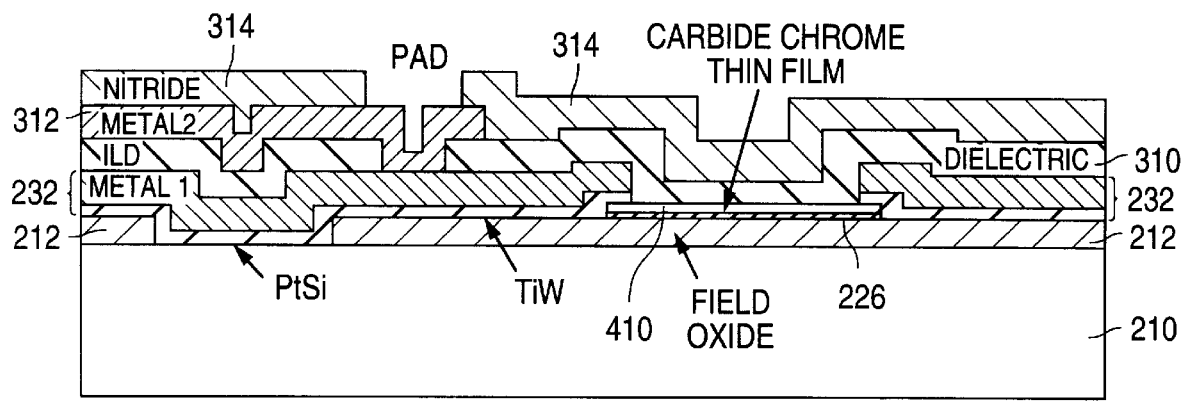
FIG. 5 is a cross-sectional diagram that illustrates a thin-film resistor formed with the alternate process in accordance with the present invention.

At this point, the process continues as described above by removing sacrificial layer 220, followed by the formation of interconnect layer 232 and mask 234 as shown in FIG. 3C. The process further continues as described above to form the device shown in FIG. 5. As shown in FIG. 5, although interconnect layer 232 no longer overlaps and contacts the top surface of SiCCr layer 226 due to the presence of layer 410, sufficient contact is made at the ends of SiCCr layer 226.

In accordance with the present invention, the resistivity ρ of a SiCCr resistor (and therefore the resistance R and TCR of the SiCCr resistor) can be tailored to have a specific value by varying the elemental composition of the silicon, carbon, and chromium used to form the resistor.

The resistivity ρ of a resistor is a specific property of the composition of materials that is used to form the resistor. The resistance R of a resistor is a function of the size of a resistor, and is defined in EQ. 1 as:

$$R = \rho L/A \qquad \text{EQ.1}$$

where L is the length of the resistor and A is the cross-sectional area of the resistor.

The temperature coefficient of resistance (TCR) of a resistor is a measure of the change of resistance over temperature, and is defined in EQ. 2 as:

$$TCR = dR/RdT \qquad \text{EQ.2}$$

where dT is the difference between the present temperature and 20° C., and dR is the difference between the resistivity ρ of the materials at the present temperature and 20° C.

In addition to the resistivity ρ, resistance R, and TCR of a SiCCr resistor, any special resistor value matching requirements can also be met by varying the elemental composition of the silicon, carbon, and chromium used to form the resistor.

Prior to being combined, silicon and carbon have large negative TCRs, while chromium has a large positive TCR. For example, a resistor having a composition by weight of 50% silicon and 50% carbon has a TCR of approximately −1400 ppm/° C. before the end of the line anneal, while a 100% carbon resistor has a TCR of approximately −250 ppm/° C. at 10 ohms/square and −400 ppm/° C. at 100 ohms/square. A 100% chromium resistor, on the other hand, has a TCR of approximately +3000 ppm/° C.

Adding chromium to the silicon and carbon moves the TCR of the SiCCr resistor towards zero. The changes in TCR that result from adding chromium are non-linear, and depend on the amount of silicon and carbon that is consumed by the added chromium.

The SiCCr thin-film resistors of the present invention have demonstrated the best-in-class performances ever reported in thin-film resistor technology. For example, a SiCCr thin-film resistor approximately 50–100 Å thick having a composition of between and about 15–30% silicon, 10–20% carbon, and 50–70% chromium by weight has a TCR between and about −10.0 ppm/° C. and +1.0 ppm/° C. with a linearity over a temperature range between −40° C. and ±125° C.; a resistor value matching of between and about 0 to 1%, a tracking of less than or about 0.40 ppm/° C., and a voltage-current linearity over 150 volts.

The compositions are not limited to these ranges. In theory, the amount of carbon in the composition may vary from greater than 0% to 20%, while the amount of chromium may vary from greater than 0% to 90%. For example, a resistor having a composition of 15% silicon, 10% carbon, and 75% chromium produces a resistor with a TCR of approximately −40 to −50 ppm/° C. before the end of the line anneal, and a TCR of approximately −10 to +5 ppm/° C. after the end of the line anneal.

In an alternate method, the deposition of titanium tungsten layer 232A is omitted so that aluminum copper silicon layer 232B is formed directly on platinum silicide layer 216. The alternate may be further modified so that a layer of titanium tungsten is deposited on the silicon carbide chrome layer 226 prior to the formation of mask 230.

In addition, rather than using silicon and carbon, germanium may theoretically be used in place of the silicon or carbon to form germanium, carbide, chrome, or silicon germanium chrome resistors. Further, rather than using chromium, nickel may theoretically be used instead to form silicon, carbide, nickel resistors.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a thin-film resistor on a semiconductor device, the semiconductor device having a semiconductor material and an isolation region formed on the semiconductor material, the method comprising the steps of:

forming a layer of sacrificial material on the isolation region;

removing a selected portion of the layer of sacrificial material to form an exposed portion of the isolation region; and forming a layer of resistive material over the exposed portion of the isolation region and the layer of sacrificial material, the layer of resistive material including a percentage by weight of silicon, a percentage by weight of carbon, and a percentage by weight of chromium, the percentage by weight of silicon ranging from 15–30%, the percentage by weight of carbon ranging from 10–20%, and the percentage by weight of chromium ranging from 50–70%.

2. The method of claim 1 wherein the isolation region includes a layer of field oxide formed on the semiconductor material.

3. The method of claim 1 wherein the layer of resistive material has a thickness ranging from 50 Å to 100 Å.

4. The method of claim 1 wherein the layer of sacrificial material includes a layer of titanium tungsten and an overlying layer of aluminum copper.

5. The method of claim 1 wherein the layer of resistive material is deposited at a temperature ranging from 15° C. to 65° C.

6. The method of claim 1 and further comprising the steps of:

removing selected portions of the layer of resistive material to form a resistor; and removing the layer of sacrificial material.

7. The method of claim 6 and further comprising the steps of:

forming a layer of interconnect material over the resistor, and the isolation region;

removing selected portions of the layer of interconnect material to form an interconnect trace connected to the resistor; and forming a layer of dielectric material over the interconnect trace, the layer of dielectric material having an opening that exposes a portion of the interconnect trace;

forming a layer of metal over the dielectric layer and the exposed portion of the interconnect trace; and annealing after the interconnect trace has been formed.

8. The method of claim 6 and further comprising the steps of:

forming a layer of interconnect material over the resistor, and the isolation region; and removing selected portions of the layer of interconnect material to form interconnect traces that connect the resistor to a circuit device.

9. The method of claim 8 wherein the layer of interconnect material includes a layer of titanium tungsten and an overlying layer of aluminum copper.

10. The method of claim 8 and further comprising the step of annealing after the interconnect traces have been formed.

11. The method of claim 10 wherein the layer of resistive material has a temperature coefficient of resistance (TCR) ranging from −10.0 ppm/° C. to +1.0 ppm/° C.

12. The method of claim 11 wherein the TCR is substantially linear over a temperature ranging from −40° C. to +125° C.

13. The method of claim 1 and further comprising the steps of:

forming a layer of protective material on the layer of resistive material;

removing selected portions of the layer of protective material and the layer of resistive material to form a resistor; and removing the layer of sacrificial material.

14. The method of claim 13 and further comprising the steps of:

forming a layer of interconnect material over the protected resistor, and the isolation region;

removing selected portions of the layer of interconnect material to form an interconnect trace connected to the protected resistor; and forming a layer of dielectric material over the interconnect trace, the layer of dielectric material having an opening that exposes a portion of the interconnect trace;

forming a layer of metal over the dielectric layer and the exposed portion of the interconnect trace; and annealing after the interconnect trace has been formed.

15. The method of claim 13 and further comprising the steps of:

forming a layer of interconnect material over the protected resistor, and the isolation region; and removing selected portions of the layer of interconnect material to form interconnect traces that connect the protected resistor to a circuit device.

16. The method of claim 15 and further comprising the step of annealing after the interconnect traces have been formed.

17. A method for forming a thin-film resistor on a semiconductor device, the semiconductor device having a semiconductor material and an isolation region formed on the semiconductor material, the method comprising the steps of:

forming a layer of sacrificial material on the isolation region;

removing a selected portion of the layer of sacrificial material to form an exposed portion of the isolation region;

forming a layer of resistive material over the exposed portion of the isolation region and the layer of sacrificial material, the layer of resistive material consisting of a percentage by weight of silicon, a percentage by weight of carbon, and a percentage by weight of chromium, the percentage by weight of silicon ranging from 15–30%, the percentage by weight of carbon ranging from 10–20%, and the percentage by weight of chromium ranging from 50–70%;

removing selected portions of the layer of resistive material to form a resistor; and removing the layer of sacrificial material.

18. The method of claim 17 wherein the resistor has a thickness ranging from 50 Å to 100 Å.

19. A method for forming a thin-film resistor on a semiconductor device, the semiconductor device having a semiconductor material and an isolation region formed on the semiconductor material, the method comprising the steps of:

forming a layer of sacrificial material on the isolation region;

removing a selected portion of the layer of sacrificial material to form an exposed portion of the isolation region;

forming a layer of resistive material over the exposed portion of the isolation region and the layer of sacrificial material, the layer of resistive material having a percentage by weight of a first element selected from the group consisting of silicon and germanium, a percentage by weight of a second element selected from the group consisting of chromium and nickel, and a percentage by weight of a third element consisting of carbon, the percentage by weight of silicon ranging from 15–30%, the percentage by weight of carbon ranging from 10–20%, and the percentage by weight of chromium ranging from 50–70%;

removing selected portions of the layer of resistive material to form a resistor; and removing the layer of sacrificial material.

20. The method of claim 19 wherein the resistor has a thickness ranging from 50 Å to 100 Å.

21. A method for forming a thin-film resistor on a semiconductor device, the semiconductor device having a semiconductor material and an isolation region formed on the semiconductor material, the method comprising the steps of:

forming a layer of sacrificial material on the isolation region;

removing a selected portion of the layer of sacrificial material to form an exposed portion of the isolation region;

forming a layer of resistive material over the exposed portion of the isolation region and the layer of sacrificial material, the layer of resistive material having a percentage by weight of a first element selected from the group consisting of carbon and germanium, a percentage by weight of a second element selected from the group consisting of chromium and nickel, and a percentage by weight of a third element consisting of silicon, the percentage by weight of silicon ranging from 15–30%, the percentage by weight of carbon ranging from 10–20%, and the percentage by weight of chromium ranging from 50–70%;

removing selected portions of the layer of resistive material to form a resistor; and removing the layer of sacrificial material.

22. The method of claim 21 wherein the resistor has a thickness ranging from 50 Å to 100 Å.

23. A method for forming a thin-film resistor on a semiconductor device, the semiconductor device having a semiconductor material and an isolation region formed on the semiconductor material, the method comprising the steps of:

forming a layer of sacrificial material on the isolation region;

removing a selected portion of the layer of sacrificial material to form an exposed portion of the isolation region; and forming a layer of resistive material over the exposed portion of the isolation region and the layer of sacrificial material, the layer of resistive material including a percentage by weight of silicon, a percentage by weight of carbon, and a percentage by weight of chromium, the percentage by weight of silicon ranging from 15–30%, the percentage by weight of carbon ranging from 10–20%, and the percentage by weight of chromium ranging from 50–75%.

24. The method of claim 23 and further comprising the steps of:

forming a layer of interconnect material over the resistor, and the isolation region;

removing selected portions of the layer of interconnect material to form an interconnect trace connected to the resistor;

forming a layer of dielectric material over the interconnect trace, the layer of dielectric material having an opening that exposes a portion of the interconnect trace;

forming a layer of metal over the dielectric layer and the exposed portion of the interconnect trace; and annealing after the interconnect trace has been formed.

25. The method of claim 23 and further comprising the steps of:

forming a layer of protective material on the layer of the layer of resistive material;

removing selected portions of the layer of protective material and the layer of resistive material to form a resistor;

removing the layer of sacrificial material forming a layer of interconnect material over the protected resistor, and the isolation region;

removing selected portions of the layer of interconnect material to form an interconnect trace connected to the protected resistor; and forming a layer of dielectric material over the interconnect trace, the layer of dielectric material having an opening that exposes a portion of the interconnect trace;

forming a layer of metal over the dielectric layer and the exposed portion of the interconnect trace; and annealing after the interconnect trace has been formed.

26. A method for forming a thin-film resistor on a semiconductor device, the semiconductor device having a semiconductor material and an isolation region formed on the semiconductor material, the method comprising the steps of:

forming a layer of sacrificial material on the isolation region;

removing a selected portion of the layer of sacrificial material to form an exposed portion of the isolation region;

forming a layer of resistive material over the exposed portion of the isolation region and the layer of sacrificial material, the layer of resistive material including a percentage by weight of silicon, a percentage by weight of carbon, and a percentage by weight of chromium;

forming a layer of interconnect material over the resistor, and the isolation region;

removing selected portions of the layer of interconnect material to form an interconnect trace connected to the resistor;

forming a layer of dielectric material over the interconnect trace, the layer of dielectric material having an opening that exposes a portion of the interconnect trace;

forming a layer of metal over the dielectric layer and the exposed portion of the interconnect trace; and annealing after the interconnect trace has been formed.

* * * * *

UNITED STATES PATENT AND TRADEMARK OFFICE
CERTIFICATE OF CORRECTION

PATENT NO. : 6,211,032 B1
DATED : April 3, 2001
INVENTOR(S) : Redford et al.

It is certified that error appears in the above-identified patent and that said Letters Patent is hereby corrected as shown below:

<u>Title page,</u>
Item [75], delete "both of Greenock, PA (US)" and replace with -- both of Greenock, Scotland --.

Signed and Sealed this

Sixteenth Day of October, 2001

Attest:

NICHOLAS P. GODICI
Attesting Officer
Acting Director of the United States Patent and Trademark Office